US 9,920,419 B2

(12) United States Patent
Ueda et al.

(10) Patent No.: US 9,920,419 B2
(45) Date of Patent: Mar. 20, 2018

(54) DRUM SPUTTERING DEVICE

(71) Applicant: HITACHI CHEMICAL COMPANY, LTD., Chiyoda-ku, Tokyo (JP)

(72) Inventors: Shunsuke Ueda, Tsukuba (JP); Eisuke Haba, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/424,123

(22) PCT Filed: Aug. 21, 2013

(86) PCT No.: PCT/JP2013/072307
§ 371 (c)(1),
(2) Date: Feb. 26, 2015

(87) PCT Pub. No.: WO2014/034497
PCT Pub. Date: Mar. 6, 2014

(65) Prior Publication Data
US 2015/0307983 A1 Oct. 29, 2015

(30) Foreign Application Priority Data
Aug. 29, 2012 (JP) ................. 2012-189309

(51) Int. Cl.
C23C 14/34 (2006.01)
C23C 14/22 (2006.01)
(Continued)

(52) U.S. Cl.
CPC ............ *C23C 14/223* (2013.01); *B22F 1/025* (2013.01); *C23C 14/3407* (2013.01);
(Continued)

(58) Field of Classification Search
CPC . C23C 14/223; C23C 14/3407; C23C 14/505; H01J 37/34; H01J 37/3414; H01J 37/3435; H01J 37/347
See application file for complete search history.

(56) References Cited

U.S. PATENT DOCUMENTS 3,517,644 A * 6/1970 Baer ..................... C23C 14/223
118/303
6,038,999 A 3/2000 Cattenot
(Continued)

FOREIGN PATENT DOCUMENTS

CN 1723294 A 1/2006
EP 0345795 A1 12/1989
(Continued)

OTHER PUBLICATIONS

Translation to Kuramoto (JP 03-153864) published Jul. 1991.*
Translation to Agawa (JP 2009-079251) published Apr. 2009.*
Chinese Patent Office Action dated Jan. 12, 2016, from corresponding Chinese Patent Application 201380044728.8, 7 pages.
(Continued)

*Primary Examiner* — John J Brayton
(74) *Attorney, Agent, or Firm* — Fitch, Even, Tabin & Flannery LLP

(57) ABSTRACT

A drum sputtering device that can uniformly deposit target atoms on all over particles is provided. The drum sputtering device includes a vacuum container 2 that contains particles, a tubular drum 10 that is arranged inside the vacuum container 2 and at least one end face 10c of which is open, and a sputtering target 16 that is arranged inside the drum 10. With a supporting arm 11, a drive motor 12 for rotation, a drive motor 13 for swing, a first gear member 14, and a second gear member 15, the drum can be rotated around the axis of the drum 10 and the drum 10 can be swung so that one end portion 10e and the other end portion 10f in the axial direction of the drum 10 are relatively vertically switched.

17 Claims, 5 Drawing Sheets

(51) Int. Cl.
　　　H01J 37/34　　　　(2006.01)
　　　C23C 14/50　　　　(2006.01)
　　　B22F 1/02　　　　　(2006.01)
(52) U.S. Cl.
　　　CPC ............ *C23C 14/505* (2013.01); *H01J 37/34* (2013.01); *H01J 37/347* (2013.01); *H01J 37/3414* (2013.01); *H01J 37/3435* (2013.01)

(56) References Cited

U.S. PATENT DOCUMENTS

| 6,241,858 | B1 | | 6/2001 | Phillips et al. | |
|---|---|---|---|---|---|
| 2006/0254903 | A1 | * | 11/2006 | Abe | ................. B01J 13/04 204/192.11 |

FOREIGN PATENT DOCUMENTS

| GB | 1497782 | A | | 1/1978 |
|---|---|---|---|---|
| JP | 03153864 | A | * | 7/1991 |
| JP | 2007-204785 | A | | 8/2007 |
| JP | 2009079251 | A | * | 4/2009 |
| JP | 2012007230 | A | | 1/2012 |
| JP | 2014-047368 | A | | 3/2014 |

OTHER PUBLICATIONS

International Search Report for International Patent Application No. PCT/JP2013/072307 dated Sep. 10, 2013.
Search Report in counterpart EP Patent Application No. 13833669.8 dated Mar. 29, 2016 in English.

* cited by examiner

Fig.5
(a)
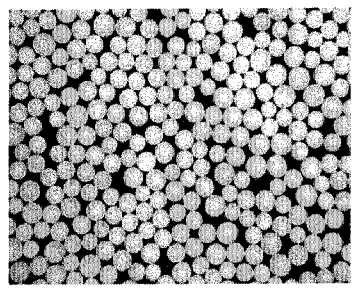
(b)
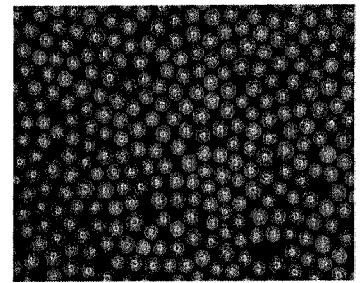
(c)
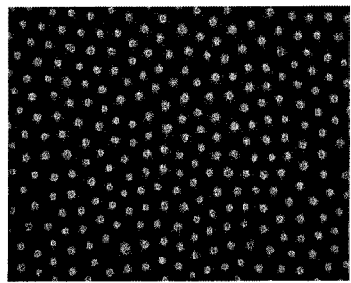
(d)
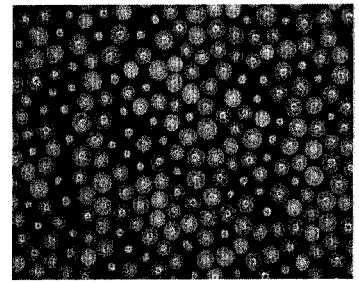

DRUM SPUTTERING DEVICE

TECHNICAL FIELD

The present invention relates to a sputtering device that performs sputtering on particles.

BACKGROUND ART

Sputtering devices are typically designed to form a metal thin film on a flat substrate. When sputtering is performed on particles by such a typical sputtering device, it is necessary to spread particles all over a thin flat container and performs sputtering on the particles in this state. With this state, typical sputtering devices can deposit target atoms sputtering from a sputtering target only on the upper surfaces of particles, disadvantageously.

In this point, Patent Literature 1 discloses a barrel sputtering apparatus that uses a tubular barrel (drum) to form coatings on fine particles. A barrel sputtering apparatus disclosed in Patent Literature 2 includes a cylindrical vacuum container that has a polygonal internal shape on a cross section and contains fine particles. This vacuum container is rotated for sputtering.

CITATION LIST

Patent Literature

[Patent Literature 1] Japanese Patent Application Laid-Open Publication No. 2009-079251
[Patent Literature 2] Japanese Patent No. 3620842

SUMMARY OF INVENTION

Technical Problem

The amount of scattered target atoms decreases with distance from the sputtering target. The barrel sputtering apparatus disclosed in Patent Literature 1 thus has a disadvantage in which the deposited amount of the target atoms is not uniform in the axial direction of a vacuum container.

Patent Literature 2 discloses a metal evaporation device that evaporates a metal onto powdery carriers by swinging the container. The metal evaporation device disclosed in Patent Literature 2, however, is not designed to perform sputtering. Thus, the matter disclosed in Patent Literature 2 cannot be simply combined with the barrel sputtering apparatus disclosed in Patent Literature 1. Furthermore, the metal evaporation device disclosed in Patent Literature 2 swings the container only for forming a coating on a powder but not for solving the above disadvantages. On account of this, even if the matter disclosed in Patent Literature 2 can be combined with the barrel sputtering apparatus disclosed in Patent Literature 1, the above disadvantages cannot be solved.

In view of the above-described disadvantages, it is an object of the present invention to provide a drum sputtering device that can uniformly deposit target atoms on all over particles.

Solution to Problem

The drum sputtering device according to the present invention includes a vacuum container that contains particles, a tubular drum that is arranged inside the vacuum container and at least one end face of which is open, a sputtering target that is arranged inside the drum, a rotation mechanism that rotates the drum around the axis of the drum, and a swing mechanism that swings the drum so that one end portion and the other end portion in the axial direction of the drum are relatively vertically switched.

The drum sputtering device according to the present invention can perform sputtering while particles are stirred by rotating the drum to which the particles have been supplied. In doing so, target atoms sputtering from the sputtering target can be deposited on the entire surfaces of the particles. The drum can also be swung so that the one end portion and the other end portion in the axial direction of the drum are relatively vertically switched. In doing so, the particles supplied into the drum can be reciprocated in the axial direction of the drum. In such a manner, the target atoms can be uniformly deposited on all over the particles. With this configuration, when the drum is inclined, the particles are discharged from the inside of the drum, whereby the particles can be easily recovered from the inside of the drum. Furthermore, because swing of the drum is utilized to incline the drum, the particles can be recovered without adding another function to discharge the particles from the inside of the drum. This configuration can simplify the drum sputtering device.

In this configuration, both end portions of the drum in the axial direction may be constricted. With this configuration, the particles can be prevented from dropping off from the inside of the drum while the drum is swung for sputtering.

The drum sputtering device may further include a particle supplying chamber that is connected to the vacuum container, a first opening and closing device that opens and closes the space between the vacuum container and the particle supplying chamber, a first vacuuming device that vacuums air in the particle supplying chamber, and a first atmosphere releasing device that supplies air into the particle supplying chamber. With this configuration, after the particle supplying chamber is brought into a vacuum state by the first vacuuming device, the first opening and closing device is opened to supply the particles from the particle supplying chamber into the drum and then is closed, whereby the particles are supplied into the drum while the vacuum container is kept in the vacuum state. The first atmosphere releasing device then supplies air into the particle supplying chamber, thereby releasing the inside of the particle supplying chamber having been in a vacuum state, into the atmosphere. This allows the first opening and closing device to open and close. This configuration enables the particles to be supplied to the particle supplying chamber while sputtering is performed in the vacuum chamber. Sputtering can be thus performed repeatedly without returning the vacuum container to the atmospheric state, which enhances productivity.

The drum sputtering device may further include a particle recovering chamber that is connected to the vacuum container and is arranged below the drum, a second opening and closing device that opens and closes the space between the vacuum container and the particle recovering chamber, a second vacuuming device that vacuums air in the particle recovering chamber, and a second atmosphere releasing device that supplies air into the particle recovering chamber. With this configuration, after the particle recovering chamber is brought into a vacuum state by the second vacuuming device, the second opening and closing device is opened and the drum is inclined to drop the particles into the particle recovering chamber. Subsequently, the second opening and closing device is closed. The particles can be thus recovered from the inside of the drum into the particle recovering chamber while the vacuum container is kept in the vacuum state. The second atmosphere releasing device then supplies air into the particle recovering chamber, thereby releasing the inside of the particle recovering chamber having been in a vacuum state, into the atmosphere. This allows the second opening and closing device to open and close. This configuration enables the particles to be recovered from the particle recovering chamber while sputtering is performed in the vacuum chamber. Sputtering can be thus performed repeatedly without returning the vacuum container to the atmospheric state, which enhances productivity.

The drum sputtering device may further include an oxygen supplying device that supplies oxygen into the vacuum container. If the drum is rotated around the axis at high speed, the particles may collide with the inner wall of the drum, causing the target atoms to fall off from the particles. In consideration of this, sputtering is performed while a trace amount of oxygen is supplied into the vacuum container together with a sputtering gas, such as argon gas. Some of the target atoms are then oxidized, which enhances the joint strength to the particles. This configuration can prevent the target atoms from falling off from the particles even when the drum is rotated around the axis.

Advantageous Effects of Invention

According to the present invention, the target atoms can be uniformly deposited on all over the particles.

BRIEF DESCRIPTION OF DRAWINGS

FIGS. 5(a) to 5(d) are photographs of beads.

DESCRIPTION OF EMBODIMENTS

A preferred embodiment of the drum sputtering device according to the present invention is described in detail below with reference to the accompanying drawings. In all of the drawings, like numerals refer to like or equivalent components.

Figure 1:
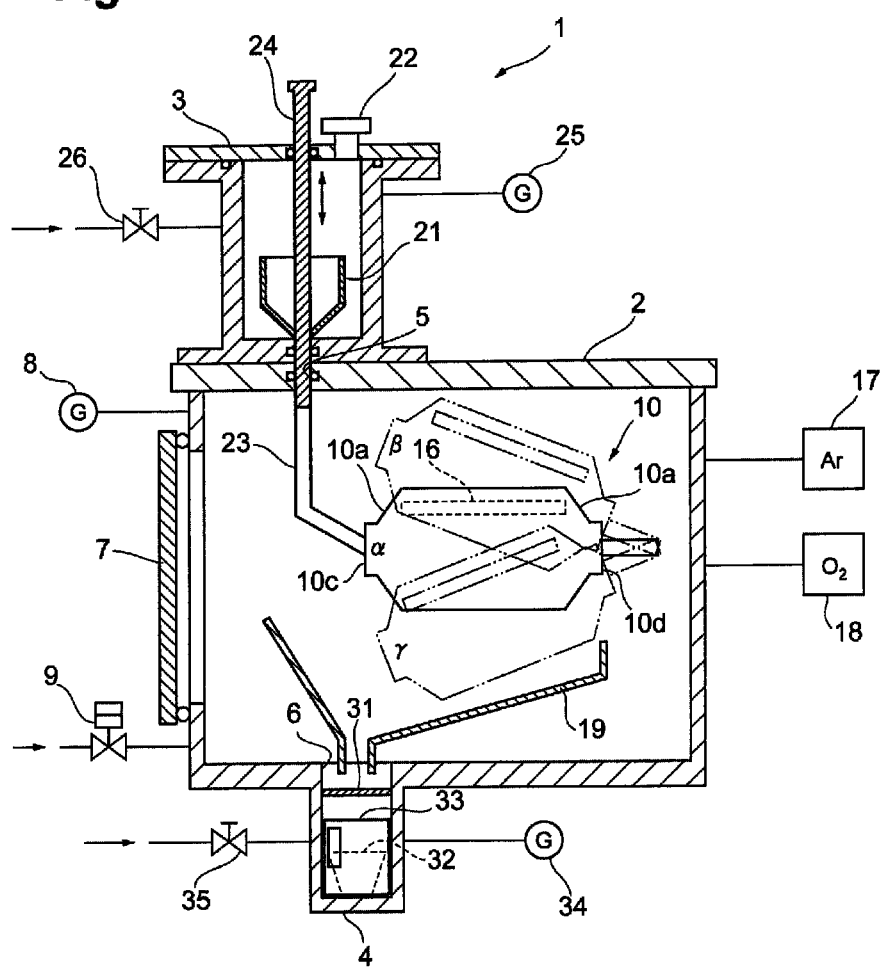
FIG. 1 is a longitudinal sectional diagram of a drum sputtering device according to an embodiment.
Figure 2:
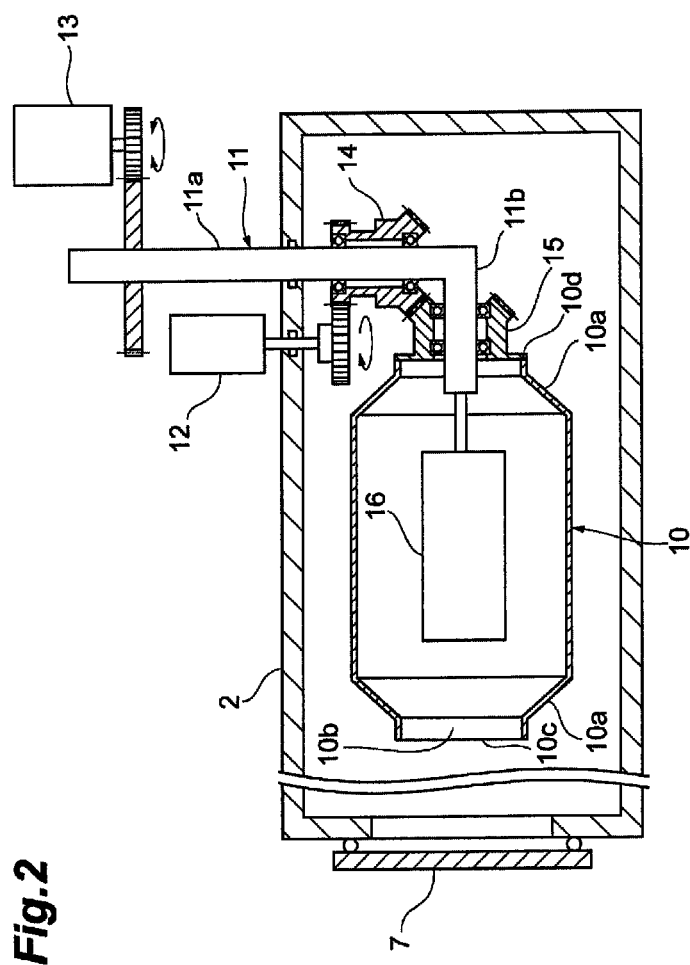
FIG. 2 is a cross sectional diagram of the drum sputtering device according to the embodiment.

FIG. 1 is a longitudinal sectional diagram of a drum sputtering device. FIG. 2 is a cross sectional diagram of the drum sputtering device. As FIGS. 1 and 2 illustrate, this drum sputtering device 1 according to the present embodiment includes a vacuum container 2 in which sputtering is performed, a particle supplying chamber 3 that is connected to the vacuum container 2 and is configured to supply particles into the vacuum container 2, and a particle recovering chamber 4 that is connected to the vacuum container 2 and is configured to recover the particles from the vacuum container 2. An upper communication opening 5 that communicates between the vacuum container 2 and the particle supplying chamber 3 is formed at a position between the vacuum container 2 and the particle supplying chamber 3. A lower communication opening 6 that communicates between the vacuum container 2 and the particle recovering chamber 4 is formed at a position between the vacuum container 2 and the particle recovering chamber 4.

The vacuum container 2 is provided with a main hatch 7 for opening and closing the vacuum container 2. The vacuum container 2 is also connected to a vacuum pump 8 that sucks the air in the vacuum container 2 into a vacuum and a leak valve 9 for supplying air into the vacuum container 2 having been in a vacuum state. With this configuration, the inside of the vacuum container 2 can be brought into a vacuum state by closing the main hatch 7 and sucking the air in the vacuum container 2 into a vacuum by the vacuum pump 8. Air is supplied through the leak valve 9 into the vacuum container 2 having been in a vacuum state. The vacuum container 2 is then returned to the atmospheric state, allowing the main hatch 7 to open and close.

A drum 10 that is configured to contain particles is arranged inside the vacuum container 2.

The drum 10 has a tubular shape with which particles can be contained therein and is arranged so that the central axis (hereinafter simply called the "axis") of the drum 10 is oriented to the horizontal direction. The shape of the drum 10 is not particularly limited to a tubular shape and may be, for example, a cylindrical shape or a polygonal tubular shape. The inner surface shape of the drum 10 is also not particularly limited and may be, for example, circular or polygonal in cross section. A member such as a stirring plate that stirs the particles may also be attached to the inner surface of the drum 10. Both end portions 10a of the drum 10 in the axial direction are constricted (reduced in the diameter) into a funnel shape so as not to drop off the contained particles therefrom. An opening 10b that is configured to supply particles into the drum 10 is formed at one end face 10c in the axial direction of the drum 10. The other end face 10d that opposes the opening 10b in the axial direction of the drum 10 may or may not be opened.

The drum 10 is pivotally supported to be rotatable around the axis and also pivotally supported to be vertically tiltable with a substantially L-shaped supporting arm 11 that extends from the side wall of the vacuum container 2. The drum sputtering device 1 includes, outside the vacuum container 2, a drive motor 12 for rotation that rotationally drives the drum 10 around the axis and a drive motor 13 for swing that drives the drum 10 to tilt vertically.

Specifically, the supporting arm 11 includes a base end arm portion 11a that perpendicularly extends from the side wall of the vacuum container 2 and a leading end arm portion 11b that is bended at the tip of the base end arm portion 11a at a right angle. The base end arm portion 11a is pivotally supported so as to be rotatable around the axis of the base end arm portion 11a against the vacuum container 2.

The base end arm portion 11a is directly or indirectly engaged with the drive shaft of the drive motor 13 for swing so that the axis of the drive shaft of the drive motor 13 for swing is arranged in parallel with the axis of the base end arm portion 11a. The leading end arm portion 11b extends in the direction corresponding to the axis of the drum 10, and its tip is inserted into the drum 10.

The base end arm portion 11a is coupled to a circular first gear member 14 with a bearing, such as a ball bearing, interposed therebetween. With this configuration, the base end arm portion 11a and the first gear member 14 are coupled to be mutually rotatable in a direction around the axis of the base end arm portion 11a. The drive shaft of the drive motor 12 for rotation is directly or indirectly engaged with the first gear member 14 so that the axis of the drive shaft of the drive motor 12 for rotation is arranged in parallel with the axis of the base end arm portion 11a.

The leading end arm portion 11b is coupled to a circular second gear member 15 with a bearing, such as a ball bearing, interposed therebetween. With this configuration, the leading end arm portion 11b and the second gear member 15 are coupled to be mutually rotatable in a direction around the axis of the leading end arm portion 11b. The second gear member 15 is fixed at the other end face 10d of the drum 10 so that the axis of the drum 10 corresponds to the axis of the leading end arm portion 11b.

Bevel gears are formed in the first gear member 14 and the second gear member 15, respectively, the bevel gears transmitting rotation between the two shafts that are orthogonal to each other. The first gear member 14 is engaged with the second gear member 15 using these bevel gears.

With this configuration, when the drive shaft of the drive motor 12 for rotation is rotationally driven, this rotational driving is transmitted to the drum 10 via the first gear member 14 and the second gear member 15. The drum 10 then rotates around the axis.

Furthermore, when the drive shaft of the drive motor 13 for swing is rotationally driven, the base end arm portion 11a rotates in a direction around the axis of the base end arm portion 11a. The leading end arm portion 11b is then tilted so that the connecting point with the base end arm portion 11a serves as the central axis. Following this movement, the drum 10 is vertically tilted so that the connecting point between the base end arm portion 11a and the leading end arm portion 11b serves as the central axis. When the rotational direction of the driving shaft of the drive motor 13 for swing is reversed during this operation, the tilting direction of the drum 10 is vertically reversed. While the drive shaft of the drive motor 13 for swing is rotationally driven, the rotational direction of the drive shaft of the drive motor 13 for swing is reversed every time the angle of the tilted drum 10 reaches a given angle. The drum 10 is thus swung so that the one end portion and the other end portion in the axial direction are relatively vertically switched.

Figure 3:
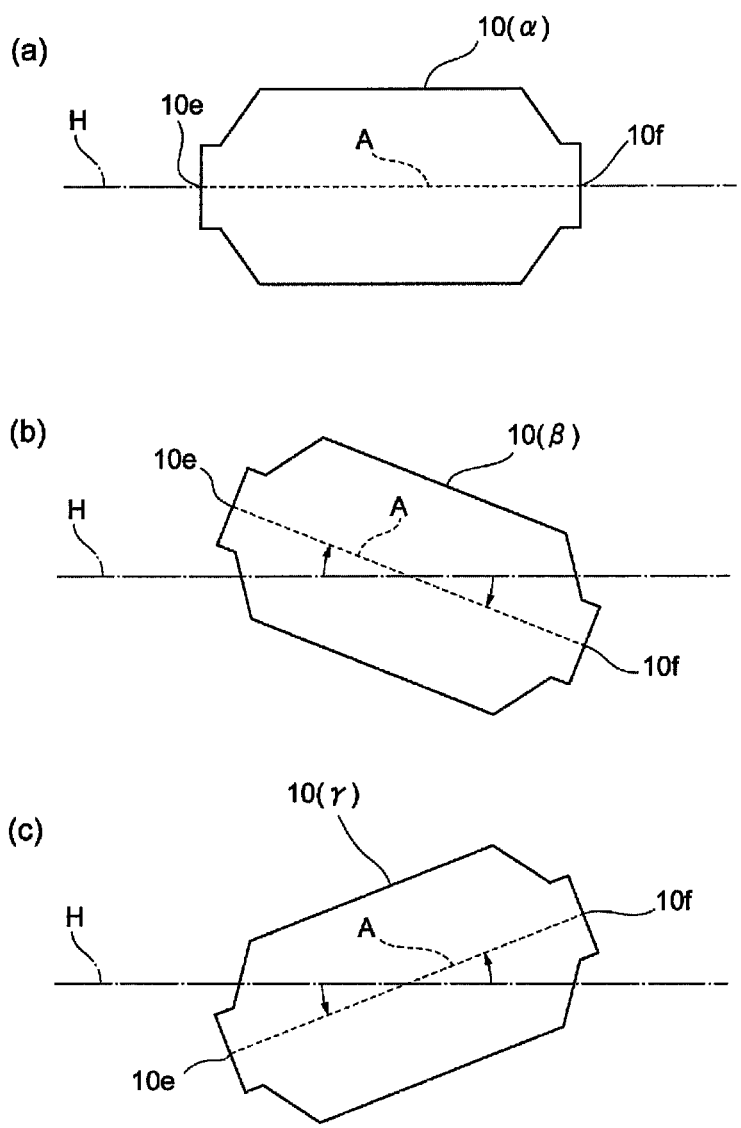
FIGS. 3(a) to 3(c) are elevation schematics illustrating the positions of the drum.

The swing of the drum 10 is described herein in more detail also with reference to FIG. 3. FIGS. 3(a) to 3(c) are elevation schematics illustrating the positions of the drum. In FIG. 3, a reference sign A denotes the axis of the drum 10, and a reference sign H denotes the horizontal axis passing through the center of the drum 10 in the axial direction.

A horizontal position α (FIG. 3(a)) will be described. In the drum 10 with this position, the axis A and the horizontal axis H overlap, and the one end portion 10e in the axial direction of the drum 10 and the other end portion 10f in the axial direction of the drum 10 become the same in height.

In this position, when the drive shaft of the drive motor 13 for swing is rotationally driven, the drum 10 is tilted so that the one end portion 10e moves upward from the horizontal axis H while the other end portion 10f moves downward from the horizontal axis H. The axis A of the drum 10 is thus inclined with respect to the horizontal axis H, resulting in a first inclined position β (FIG. 3(b)) in which the one end portion 10e is higher than the other end portion 10f.

Subsequently, the rotational direction of the drive shaft of the drive motor 13 for swing is reversed, and then, the drive shaft of the drive motor 13 for swing is rotationally driven. The drum 10 is then tilted so that the one end portion 10e and the other end portion 10f move closer to the horizontal axis H. The drum 10 is thus returned back to the horizontal position α (FIG. 3(a)). Furthermore, when the drive shaft of the drive motor 13 for swing is rotationally driven in the same rotational direction, the drum 10 is tilted so that the one end portion 10e moves downward from the horizontal axis H while the other end portion 10f moves upward from the horizontal axis H. The axis A of the drum 10 is thus inclined with respect to the horizontal axis H, resulting in a second inclined position γ (FIG. 3(c)) in which the one end portion 10e is lower than the other end portion 10f.

Subsequently, the rotational direction of the drive shaft of the drive motor 13 for swing is reversed, and then, the drive shaft of the drive motor 13 for swing is rotationally driven. The drum 10 is then tilted so that the one end portion 10e and the other end portion 10f move closer to the horizontal axis H. The drum 10 is thus returned back to the horizontal position α (FIG. 3(a)).

In such a manner, the drive shaft of the drive motor 13 for swing is rotationally driven, and the rotational direction of the drive shaft of the drive motor 13 for swing is reversed every time the angle of the tilted drum 10 reaches a given angle. The position of the drum 10 is shifted to (1) the horizontal position α, (2) the first inclined position β, (3) the horizontal position α, (4) the second inclined position γ, and (5) the horizontal position α, in this order. This cycle from (1) to (5) is repeated. With this repetition, the drum 10 swings so that the one end portion 10e and the other end portion 10f in the axial direction are relatively vertically switched.

A sputtering target 16 is arranged inside the drum 10 having such a configuration. The sputtering target 16 is arranged so as to be attachable to and detachable from the leading end arm portion 11b that is inserted into the drum 10. With this configuration, the sputtering target 16 follows only the swing of the drum 10 and does not follow the rotation of the drum 10 around the axis. The sputtering target 16 may be arranged at any position inside the drum 10. In terms of efficiently depositing the target atoms on the particles, the sputtering target 16 is preferably arranged at the center of the drum 10 in the axial direction.

A guiding member 19 with a substantially funnel shape that guides the particles discharged from the drum 10 into the lower communication opening 6 is attached to the inside of the vacuum container 2.

A sputtering gas supplying device 17 that supplies a sputtering gas for causing the sputtering target 16 to sputter, into the vacuum container 2 and an oxygen supplying device 18 that supplies oxygen into the vacuum container 2 are connected to the vacuum container 2. The sputtering gas supplying device 17 and the oxygen supplying device 18 may be integrally configured. In this configuration, a sputtering gas and oxygen are supplied into the vacuum container 2 in a mixed state.

The sputtering gas may be any gas so long as it is an inert gas that can cause the sputtering target 16 to sputter but is preferably argon gas in terms of sputtering efficiency.

The particle supplying chamber 3 is configured to supply particles into the drum 10 and is arranged at the top of the vacuum container 2.

A particle supplying container 21 that stores particles is installed inside the particle supplying chamber 3. A supply door 22 that is opened and closed for supplying the particles to the particle supplying container 21 is attached to the top of the particle supplying chamber 3.

A supply nozzle 23 for supplying the particles supplied to the particle supplying container 21 into the drum 10 is attached to the particle supplying container 21. The supply nozzle 23 extends from the particle supplying container 21 to the opening 10b of the drum 10 through the upper communication opening 5. The supply nozzle 23 is hermetically connected to the upper communication opening 5. The vacuum container 2 is communicated to the particle supplying container 21 only through the supply nozzle 23.

A supply mechanism 24 that is inserted into and removed from the supply nozzle 23 through the particle supplying container 21 is provided at the particle supplying chamber 3. The supply mechanism 24 is formed into a bar shape that vertically extends, and its upper portion passes through the particle supplying chamber 3 and is exposed to the outside of the particle supplying chamber 3. The supply mechanism 24 is hermetically slidable against the particle supplying chamber 3 and can be inserted into and removed from the supply nozzle 23. With this configuration, when the supply mechanism 24 is pulled up, the supply nozzle 23 is opened. The particles stored in the particle supplying container 21 are then supplied into the drum 10 through the supply nozzle 23. In contrast, when the supply mechanism 24 is pushed down, the supply nozzle 23 is closed. The supplying of the particles into the drum 10 is then stopped, and the space between the particle supplying chamber 3 and the vacuum container 2 are hermetically maintained.

A vacuum pump 25 that sucks the air in the particle supplying chamber 3 into a vacuum and a leak valve 26 for supplying air into the particle supplying chamber 3 having been in a vacuum state are connected to the particle supplying chamber 3. With this configuration, the inside of the particle supplying chamber 3 can be brought into a vacuum state by closing the supply door 22, inserting the supply mechanism 24 into the supply nozzle 23, and sucking the air in the particle supplying chamber 3 into a vacuum by the vacuum pump 25. In addition, air is supplied through the leak valve 26 into the particle supplying chamber 3 having been in a vacuum state. The particle supplying chamber 3 is then returned to the atmospheric state, allowing the supply door 22 to open and close.

The particle recovering chamber 4 is configured to recover the particles discharged from the inside of the drum 10 and is arranged below the vacuum container 2 and directly below the opening 10b of the drum 10. A door 31 for the lower communication opening that hermetically opens and closes the lower communication opening 6 communicating between the vacuum container 2 and the particle recovering chamber 4 is attached to the lower communication opening 6.

A particle recovering container 32 that recovers the particles is installed inside the particle recovering chamber 4. A recovery door 33 that is opened and closed for loading and unloading the particle recovering container 32 is attached to the side face of the particle recovering chamber 4.

A vacuum pump 34 that sucks the air in the particle recovering chamber 4 into a vacuum and a leak valve 35 for supplying air into the particle recovering chamber 4 having been in a vacuum state are connected to the particle recovering chamber 4. With this configuration, the inside of the particle recovering chamber 4 can be brought into a vacuum state by closing the door 31 for the lower communication opening and the recovery door 33, and sucking the air in the particle recovering chamber 4 into a vacuum by the vacuum pump 34. In addition, air is supplied through the leak valve 35 into the particle recovering chamber 4 having been in a vacuum state. The particle recovering chamber 4 is then returned to the atmospheric state, allowing the recovery door 33 to open and close.

A sputtering method performed by the drum sputtering device 1 according to the present embodiment will be described.

Figure 4:
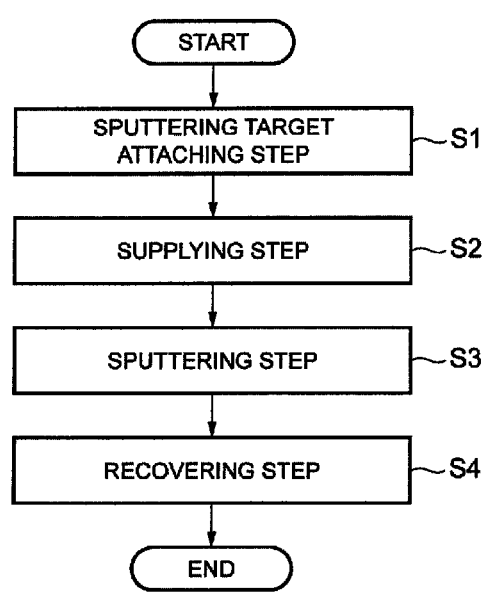
FIG. 4 is a flowchart of a sputtering method performed by the drum sputtering device according to the present embodiment.

FIG. 4 is a flowchart of a sputtering method performed by the drum sputtering device according to the present embodiment.

As FIG. 4 illustrates, when the drum sputtering device 1 according to the present embodiment performs sputtering on particles, a sputtering target attaching step (S1) in which the sputtering target 16 is installed in the drum 10 is performed.

In the sputtering target attaching step (S1), the main hatch 7 is opened, and then, the sputtering target 16 is attached to the leading end arm portion 11b. After the attachment of the sputtering target 16 is completed, the main hatch 7 is closed. The sputtering target 16 is thus installed in the drum 10.

Next, a supplying step (S2) in which the particles are supplied into the drum 10 is performed.

In the supplying step (S2), the supply mechanism 24 is pushed down to close the supply nozzle 23, and the particles are supplied from the supply door 22 to the particle supplying container 21. The supply door 22 is then closed, and the vacuum pump 25 sucks the air in the particle supplying chamber 3 into a vacuum. Subsequently, the supply mechanism 24 is pulled up to open the supply nozzle 23, and the particles supplied to the particle supplying container 21 are supplied through the supply nozzle 23 into the drum 10. With this configuration, when the vacuum container 2 is in a vacuum state, the particles can be supplied into the drum 10 while the vacuum container 2 is kept in the vacuum state. When the supplying step (S2) is performed for the first time, and the vacuum container 2 is in the atmospheric state, there is no need for the vacuum pump 25 to suck the air in the particle supplying chamber 3 into a vacuum. After the supplying of the particles into the drum 10 is completed, the supply mechanism 24 is pushed down to close the supply nozzle 23. Air is then supplied through the leak valve 26 into the particle supplying chamber 3, whereby the particle supplying chamber 3 having been in a vacuum state is opened to the atmosphere. The particle supplying chamber 3 is thus prepared for the subsequent supply of particles.

Next, a sputtering step (S3) in which target atoms are deposited on the particles supplied into the drum 10 is performed.

In the sputtering step (S3), the vacuum pump 8 sucks the air in the vacuum container 2 into a vacuum. During this operation, the supply mechanism 24 and the door 31 for the lower communication opening are closed to hermetically maintain the inside of the vacuum container 2. When the sputtering step (S3) at this time is the second time or more, and the inside of the vacuum container 2 is already maintained in a vacuum state, there is no need for the vacuum pump 8 to suck the air in the vacuum container 2 into a vacuum. An operation to suck the air in the vacuum container 2 into a vacuum in the sputtering step (S3) can be performed concurrently with an operation to open the particle supplying chamber 3 to the atmosphere in the supplying step (S2). Subsequently, the drum 10 is rotated around the axis and also is swung so that the one end portion 10e and the other end portion 10f are relatively vertically switched by driving the drive motor 12 for rotation and the drive motor 13 for swing.

The rotational speed of the drum 10 is not particularly limited but may be, for example, from 0.1 rpm or higher and 60.0 rpm or lower. In this case, the rotational speed of the drum 10 is preferably 0.5 rpm or higher and 30.0 rpm or lower and more preferably 1.0 rpm or higher and 20.0 rpm or lower.

Although the drum 10 favorably has a high rotational speed in respect of stirring properties, the drum 10 favorably has a low rotational speed in respect of falling off of the target atoms. The upper limit of the rotational speed varies depending on the size or the specific gravity of the particles, or the amount of the particles filling the drum 10, but is preferably 60.0 rpm or lower in order to prevent the particles from rotating together with the drum 10 and not dropping. The upper limit of the rotational speed is more preferably 30.0 rpm or lower in order to prevent the particles from floating in the drum 10, being deposited on a target electrode part (not shown), and causing a short circuit. The most preferable upper limit of the rotational speed is 20.0 rpm or lower in order to prevent the particles from colliding with the inner wall of the drum 10 and causing the target atoms to fall off from the particles. The lower limit of the rotational speed is preferably 0.1 rpm or higher in order to prevent the particles from being deposited on the inner wall of the drum 10 and being not able to be stirred. The lower limit of the rotational speed is more preferably 0.5 rpm or higher and further preferably 1.0 rpm or higher in order to uniformly form the target atoms on the whole surfaces of the particles.

With this configuration, the particles are prone to fly in the rotational direction of the drum 10 in accordance with the increase in the rotational speed of the drum 10. Under the circumstances, an angle changing mechanism that changes the installation angle of the sputtering target 16 is preferably provided on, for example, the leading end arm portion 11b of the supporting arm 11, on which the sputtering target 16 is installed. The installation angle of the sputtering target 16 is preferably changed by the angle changing mechanism depending on the rotational speed of the drum 10. With this mechanism, the target atoms can be efficiently deposited on all over the particles with reliability even if the rotational speed of the drum 10 increases.

The maximum inclination angle of the drum 10 can be appropriately set to the extent that the particles do not drop from the inside of the drum 10 and may be, for example, 0.5° or larger and 45.0° or smaller. In this setting, the maximum inclination angle of the drum 10 is preferably 1.0° or larger and 30.0° or smaller and is further preferably 3.0° or larger and 15.0° or smaller. The maximum inclination angle of the drum 10, herein, indicates the maximum inclination angle of the axis A with the horizontal axis H (see FIG. 3).

If the maximum inclination angle of the drum 10 is excessively small, the particles do not move. Even if the particles move, the moving speed is low, resulting in the decrease in the swing number of the drum 10 in the sputtering step (S3). In consideration of this situation, when the maximum inclination angle of the drum 10 is set to 0.5° or larger, the movement of the particles in the axial direction of the drum 10 is promoted, and the moving speed increases. The swing number of the drum 10 can be thus increased in the sputtering step (S3). With this angle, the target atoms are readily uniformly deposited on all over the particles. Moreover, when the maximum inclination angle of the drum 10 is set to 1.0° or larger and further 2.0° or larger, this effect is further enhanced.

In contrast, if the maximum inclination angle of the drum 10 is excessively large, the moving speed of the particles becomes excessively high, and thus, the particles are prone to fall from the opening 10b of the drum 10. In addition, because the amount of the particles filling the drum 10 cannot be increased, sputtering is performed not on the particles but on the inner wall of the drum 10, which induces dirt of and flaking from the drum 10. In consideration of this situation, when the maximum inclination angle of the drum 10 is set to 45.0° or smaller, the moving speed of the particles can be prevented from becoming excessively high, and the particles can be prevented from falling through the opening 10b of the drum 10. With this angle, the amount of the particles filling the drum 10 can be increased, and thus, the dirt of and flaking from the drum 10 can be reduced.

Moreover, when the maximum inclination angle of the drum 10 is set to 30.0° or smaller and further 15.0° or smaller, this effect is further enhanced.

The moving speed of the particles in the axial direction of the drum 10 is not particularly limited but may be, for example, 0.5 cm/s or higher and 50.0 cm/s or lower. In this case, the moving speed of the particles is preferably 1.0 cm/s or higher and 30.0 cm/s or lower and further preferably 2.0 cm/s or higher and 20.0 cm/s or lower. The moving speed of the particles can be adjusted with the inclination angle of the drum 10. With a moving speed of the particles of 0.5 cm/s or higher, the swing number of the drum 10 can be increased in the sputtering step (S3). With this speed, the target atoms are readily uniformly deposited on all over the particles. Moreover, when the moving speed of the drum 10 is set to 1.0 cm/s or higher and further 2.0 cm/s or higher, this effect is further enhanced. When the moving speed of the particles is set to 50.0 cm/s or lower, the particles can be prevented from falling through the opening 10b of the drum 10. With this speed, the amount of the particles filling the drum 10 can be increased, and thus, the dirt of and flaking from the drum 10 can be reduced. Moreover, when the moving speed of the drum 10 is set to 30.0 cm/s or lower and further 20.0 cm/s or lower, this effect is further enhanced.

The swing cycle of the drum 10 is not particularly limited but may be, for example, 2 seconds or more and 120 seconds or less. In this case, the swing cycle of the drum 10 is preferably 5 seconds or more and 60 seconds or less and further preferably 10 seconds or more and 30 seconds or less. The swing cycle of the drum 10, herein, indicates a time during which the drum 10 is swung so that the one end portion 10e and the other end portion 10f are relatively vertically switched, as one cycle. In other words, the swing cycle indicates a time from when the drum 10 takes the horizontal position α, the first inclined position the horizontal position α, and the second inclined position γ in this order till when the drum 10 returns back to the horizontal position α. When the swing cycle of the drum 10 is set to 2 seconds or more, the moving area of the particles in the axial direction of the drum 10 expands, and thus, the target atoms are readily deposited on all over the particles. Moreover, when the swing cycle of the drum 10 is set to 5 seconds or more and further 10 seconds or more, this effect is further enhanced. When the swing cycle of the drum 10 is set to 120 seconds or less, the retention time of the particles at the end portion of the drum 10 in the axial direction becomes short. The target atoms can be thus uniformly deposited on each of the particles. Moreover, when the swing cycle of the drum 10 is set to 60 seconds or less and further 30 seconds or less, this effect is further enhanced.

The layer thickness of the target atoms deposited in the sputtering step (S3) is not particularly limited and is appropriately set depending on the intended use.

The sputtering target 16 is caused to sputter while the sputtering gas supplying device 17 and the oxygen supplying device 18 supply a sputtering gas and oxygen, respectively, to the vacuum container 2. The supplying of oxygen to the vacuum container 2 is not essential, but in the use of Al as the sputtering target 16, oxidization of Al enhances the joint strength to the particles, therefore oxygen is preferably supplied to the vacuum container 2 in a small amount together with a sputtering gas. The ratio of oxygen to the sputtering gas is not particularly limited but can be, for example, 0.1% or higher and 20.0% or lower. In this case, the ratio of oxygen to the sputtering gas is preferably 0.5% or higher and 15.0% or lower and further preferably 1.0% or higher and 10.0% or lower. When the ratio of oxygen to the sputtering gas is 0.1% or higher, the joint strength of the target atoms to the particles can be enhanced. Moreover, when the ratio of oxygen to the sputtering gas is 0.5% or higher and further 1.0% or higher, this effect is further enhanced. When the ratio of oxygen to the sputtering gas is 20.0% or lower, sputtering can be performed in a condition containing oxygen. Moreover, when the ratio of oxygen to the sputtering gas is 15.0% or lower and further 10.0% or lower, stable sputtering is possible even during a low-power operation.

After a given setting time has passed, the sputtering is ended, and the driving of the drive motor 12 for rotation and the drive motor 13 for swing are stopped.

Next, a recovering step (S4) in which the particles are recovered is performed.

In the recovering step (S4), the recovery door 33 is closed, and then, the air in the particle recovering chamber 4 is sucked into a vacuum by the vacuum pump 34. An operation to suck the air in the particle recovering chamber 4 into a vacuum in the recovering step (S4) can be performed concurrently with each operation in the sputtering step (S3). Subsequently, the door 31 for the lower communication opening is opened. The drive motor 13 for swing is then driven to incline the drum 10 so that the opening 10b is directed downward. The particles in the drum 10 are then discharged through the opening 10b and are guided with the guiding member 19 to enter the particle recovering container 32 installed in the particle recovering chamber 4. Subsequently, the door 31 for the lower communication opening is closed. Air is supplied through the leak valve 35 into the particle recovering chamber 4 to open the particle recovering chamber 4 having been in a vacuum state to the atmosphere. After the particle recovering chamber 4 is returned to the atmospheric state, the recovery door 33 is opened to take out the particle recovering container 32 containing the particles from the particle recovering chamber 4. With this operation, the particles can be recovered from the inside of the drum 10 while the vacuum state of the vacuum container 2 is maintained.

As described above, the drum sputtering device 1 according to the present embodiment can perform sputtering while the particles are stirred by rotating the drum 10 to which particles have been supplied. Thus, target atoms can be deposited on the entire surfaces of the particles. The drum 10 is swung so that the one end portion 10e and the other end portion 10f are relatively vertically switched. In doing so, the particles supplied into the drum 10 can be reciprocated in the axial direction of the drum 10. Thus, the target atoms can be uniformly deposited on all over the particles.

When the drum 10 is inclined, the particles are discharged from the drum 10, whereby the particles can be easily recovered from the inside of the drum 10. In addition, because swing of the drum 10 is utilized to incline the drum 10, the particles can be recovered without adding another function to discharge the particles from the drum 10. This can simplify the drum sputtering device 1.

Because both end portions 10a of the drum 10 in the axial direction are constricted, the particles can be prevented from dropping off from the inside of the drum 10 while the drum 10 is swung for sputtering.

Supplying and recovering of the particles can be performed without returning the vacuum container 2 to the atmospheric state, and thus, sputtering can be repeatedly performed without returning the vacuum container 2 to the atmospheric state. This enhances productivity.

In the case where sputtering is performed while oxygen is supplied into the vacuum container 2, the target atoms are oxidized to enhance the joint strength to the particles. This configuration can prevent the target atoms from falling off from the particles even when the drum 10 is rotated around the axis.

The preferred embodiment of the present invention is described hereinbefore, but the present invention is not limited to the embodiment.

For example, the rotation mechanism in which the drum is rotated around the axis and the swing mechanism in which the drum is swung are specifically described in the above embodiment. However, the specific configurations of the rotation mechanism and the swing mechanism are not particularly limited, and various known means can be employed.

In addition, the embodiment states that the drum is vertically tilted so that the connecting point between the leading end arm portion and the base end arm portion serves as the central axis. However, the central axis of the tilt of the drum is not limited to the embodiment. For example, the center of the drum in the axial direction may be the center of the tilt of the drum. In this case, the drum is swung like a seesaw about the center of the drum in the axial direction as the axis.

EXAMPLES

Examples of the present invention will be described, but the present invention is not limited to the examples below.

Comparative Example 1

The drum sputtering device 1 described in the above embodiment was prepared, but the particle supplying chamber 3 and the particle recovering chamber 4 were not used. Sputtering was performed for 30 minutes without swinging the drum 10. The time from when particles had been supplied till when the particles had been recovered was measured.

Example 1

The drum sputtering device 1 described in the above embodiment was prepared, and the particle supplying chamber 3 and the particle recovering chamber 4 were used. Sputtering was performed for 30 minutes while the drum 10 was swung. The time from when particles had been supplied till when the particles had been recovered was measured.

Measurement Result

In Comparative Example 1, the vacuuming of the vacuum container 2 took 150 minutes, the sputtering in the vacuum container 2 took 30 minutes, and the taking out of the particles took 30 minutes. The total time was 210 minutes.

In Example 1, the vacuuming of the particle supplying chamber 3 was performed concurrently with the sputtering in the vacuum container 2, and these operations took 30 minutes. The supplying of the particles into the drum 10 and the recovering of the particles from the drum 10 took 15 minutes. The total time was 45 minutes.

In other words, in Example 1, the supplying and the discharging of the particles were performed while the vacuum container 2 was kept in a vacuum state. Thus, the operation to vacuum the vacuum container 2 was able to be omitted. As a result, Example 1 markedly reduced the time as compared with that in Comparative Example 1.

Example 2

The drum sputtering device 1 described in the above embodiment was used to form Al catalyst supporting layers on beads as particles. In this process, the drum 10 was rotated at a rotational speed of 1 rpm for 30 minutes for sputtering. Subsequently, an Fe catalyst for carbon nanotube synthesis was deposited on the catalyst supporting layers on the beads. In this process, the drum 10 was rotated at a rotational speed of 5 rpm for nine minutes for sputtering. As the beads, 200 g of (Φ0.5 mm alumina beads was used. The average film thickness of Al was 15 nm. The average film thickness of Fe was 1.0 nm.

Comparative Example 2

An operation was performed in a similar condition to that in Example 2 except that sputtering was performed in a state where the drum 10 was not rotated and beads remained at rest.

Observation

FIGS. 5(a) to 5(d) are photographs of beads. FIG. 5(a) is a photograph before the Al catalyst supporting layers were formed in Example 2. FIG. 5(b) is a photograph after the Al catalyst supporting layers were formed in Example 2. FIG. 5(c) is a photograph after the Fe catalyst for carbon nanotube synthesis was deposited in Example 2. FIG. 5(d) is a photograph after the Fe catalyst for carbon nanotube synthesis was deposited in Comparative Example 2. Comparison between FIGS. 5(a) to 5(c) and FIG. 5(d) reveals that unevenness in sputtering on the beads in Example 2 was smaller than that in Comparative Example 2.

REFERENCE SIGNS LIST

1 . . . drum sputtering device, 2 . . . vacuum container, 3 . . . particle supplying chamber, 4 . . . particle recovering chamber, 5 . . . upper communication opening, 6 . . . lower communication opening, 7 . . . main hatch, 8 . . . vacuum pump, 9 . . . leak valve, 10 . . . drum, 10a . . . both end portions in the axial direction, 10b . . . opening, 10c . . . one end face, 10d . . . the other end face, 10e . . . one end portion, 10f . . . the other end portion, 11 . . . supporting arm (rotation mechanism, swing mechanism), 11a . . . base end arm portion, 11b . . . leading end arm portion, 12 . . . drive motor for rotation (rotation mechanism), 13 . . . drive motor for swing (swing mechanism), 14 . . . first gear member (rotation mechanism, swing mechanism), 15 . . . second gear member (rotation mechanism, swing mechanism), 16 . . . sputtering target, 17 . . . sputtering gas supplying device, 18 . . . oxygen supplying device, 19 . . . guiding member, 21 . . . particle supplying container, 22 . . . supply door, 23 . . . supply nozzle, 24 . . . supply mechanism (first opening and closing device), 25 . . . vacuum pump (first vacuuming device), 26 . . . leak valve (first atmosphere releasing device), 31 . . . door for the lower communication opening (second opening and closing device), 32 . . . particle recovering container, 33 . . . recovery door, 34 . . . vacuum pump (second vacuuming device), 35 . . . leak valve (second atmosphere releasing device), A . . . axis, H . . . horizontal axis, L . . . substantially, α . . . horizontal position, β . . . first inclined position, γ . . . second inclined position

The invention claimed is:

1. A drum sputtering device comprising:
a vacuum container;
a tubular drum arranged inside the vacuum container, having at least one end face open, and containing particles;
a sputtering target arranged inside the drum;
a rotation mechanism that rotates the drum around an axis of the drum; and
a swing mechanism that swings the drum independently of the rotation mechanism so that one end portion and the other end portion in an axial direction of the drum are relatively vertically switched,
wherein the drum is rotated by the rotation mechanism and also is swung by the swing mechanism.

2. The drum sputtering device according to claim 1, wherein both end portions of the drum in the axial direction are constricted.

3. The drum sputtering device according to claim 1, further comprising:
a particle supplying chamber that is connected to the vacuum container;
a first opening and closing device that opens and closes a space between the vacuum container and the particle supplying chamber;
a first vacuuming device that vacuums air in the particle supplying chamber; and
a first atmosphere releasing device that supplies air into the particle supplying chamber.

4. The drum sputtering device according to claim 1, further comprising:
a particle recovering chamber that is connected to the vacuum container and is arranged below the drum;
a second opening and closing device that opens and closes a space between the vacuum container and the particle recovering chamber;
a second vacuuming device that vacuums air in the particle recovering chamber; and
a second atmosphere releasing device that supplies air into the particle recovering chamber.

5. The drum sputtering device according to claim 1, further comprising:
an oxygen supplying device that supplies oxygen into the vacuum container.

6. A drum sputtering device comprising:
a vacuum container configured to contain particles;
a drum having a tubular shape arranged inside the vacuum container, having at least one end face open, and configured to contain particles;
an arm portion arranged inside the drum configured to hold a sputtering target;
a rotation mechanism that rotates the drum around an axis of the drum; and
a swing mechanism that swings the drum independently of the rotation mechanism among a horizontal position in which the axis of the drum is horizontal, a first inclined position in which the axis of the drum is inclined with respect to horizontal and in which the one end portion in an axial direction of the drum is higher than the other end portion in an axial direction of the drum, and a second inclined position in which the axis of the drum is inclined with respect to horizontal and in which the other end portion in an axial direction of the drum is higher than the one end portion in an axial direction of the drum,
wherein the drum is rotated by the rotation mechanism and also is swung by the swing mechanism.

7. The drum sputtering device according to claim 6, wherein rotation mechanism rotates the drum around the arm portion arranged inside the drum.

8. The drum sputtering device according to claim 6, wherein the swing mechanism swings the arm portion arranged inside the drum so that the sputtering target is configured to follow swing of the drum but not follow rotation of the drum around the axis of the drum.

9. The drum sputtering device according to claim 6, wherein the swing mechanism that swings the drum repeatedly in order from the horizontal position to the first inclined position, to the horizontal position, to the second inclined position and to the horizontal position.

10. The drum sputtering device according to claim 6, wherein the drum has a cylindrical shape.

11. The drum sputtering device according to claim 10, wherein the one end portion and the other end portion of the drum in the axial direction are constricted.

12. The drum sputtering device according to claim 6, wherein the drum has a polygonal tubular shape.

13. The drum sputtering device according to claim 12, wherein the one end portion and the other end portion of the drum in the axial direction are constricted.

14. The drum sputtering device according to claim 6, further comprising:
   a particle supplying chamber that is connected to the vacuum container;
   a first opening and closing device that opens and closes a space between the vacuum container and the particle supplying chamber;
   a first vacuuming device that vacuums air in the particle supplying chamber; and
   a first atmosphere releasing device that supplies air into the particle supplying chamber.

15. The drum sputtering device according to claim 6, further comprising:
   a particle recovering chamber that is connected to the vacuum container and is arranged below the drum;
   a second opening and closing device that opens and closes a space between the vacuum container and the particle recovering chamber;
   a second vacuuming device that vacuums air in the particle recovering chamber; and
   a second atmosphere releasing device that supplies air into the particle recovering chamber.

16. The drum sputtering device according to claim 6, further comprising:
   an oxygen supplying device that supplies oxygen into the vacuum container.

17. The drum sputtering device according to claim 1, further comprising an arm portion arranged inside the drum to hold the sputtering target, wherein the swing mechanism swings the arm portion arranged inside the drum so that the sputtering target is configured to follow swing of the drum but not follow rotation of the drum around the axis of the drum.

* * * * *